United States Patent [19]

Rusznyak

[11] 4,124,806
[45] Nov. 7, 1978

[54] ELECTRONIC DEVICE FOR THE PRODUCTION OF SIGNALS OF AN AMPLITUDE GREATER THAN THE AMPLITUDE OF A GIVEN PERIODIC SIGNAL

[75] Inventor: André Rusznyak, Geneva, Switzerland

[73] Assignee: Ebauches S.A., Neuchâtel, Switzerland

[21] Appl. No.: 794,618

[22] Filed: May 6, 1977

[30] Foreign Application Priority Data

May 7, 1976 [CH] Switzerland ............... 5721/76

[51] Int. Cl.² .......... H03K 1/14; H03K 4/02; H03K 3/353; G04C 3/00
[52] U.S. Cl. .......... 307/264; 58/23 A; 58/23 BA; 307/227; 307/246; 307/270; 307/296 A
[58] Field of Search ........ 307/227, 246, 264, 270, 307/279, 289, 291, DIG. 1, DIG. 4, 296 A; 58/23 A, 23 BA, 23 D, 50 R

[56] References Cited

U.S. PATENT DOCUMENTS

| | | | |
|---|---|---|---|
| 3,955,353 | 5/1976 | Astle | 58/23 BA |
| 4,000,412 | 12/1976 | Rosenthal et al. | 307/264 X |
| 4,015,420 | 4/1977 | Walker | 58/23 BA |
| 4,016,476 | 4/1977 | Morokawa et al. | 307/DIG. 1 X |
| 4,029,973 | 6/1977 | Kobayashi et al. | 307/DIG. 1 X |

FOREIGN PATENT DOCUMENTS 1,098,468  1/1968  United Kingdom .......... 307/279

OTHER PUBLICATIONS

Dickson, *IEEE Journal of Solid-State Circuits*, vol. SC-11, No. 3, pp. 374-378; 6/1976.

*Primary Examiner*—Larry N. Anagnos
*Attorney, Agent, or Firm*—Karl F. Ross

[57] ABSTRACT

An electronic circuit for pulsing a load, preferably for driving the display of an electronic wristwatch which produces signals of an amplitude greater than the input amplitude of a given periodic signal. The circuit uses two IGFET transistors which are connected by secondary terminals to the output of the circuit. Control electrodes of the IGFETS are connected to condensers while IGFET coupling transistors are used to control the charge and discharge of the charge transistors.

12 Claims, 12 Drawing Figures

ELECTRONIC DEVICE FOR THE PRODUCTION OF SIGNALS OF AN AMPLITUDE GREATER THAN THE AMPLITUDE OF A GIVEN PERIODIC SIGNAL

FIELD OF THE INVENTION

The present invention relates to a circuit for delivering pulses to a load, e.g. an IGFET transistor operating an alphanumeric display or dial of an electronic wristwatch, and, more particularly, to an electric circuit for the production of signals of an amplitude greater than the amplitude of a given periodic signal.

BACKGROUND OF THE INVENTION

There are various circuits using an Insulated-Gate Field-Effect (IGFET) transistor with a given threshold voltage which present to the current traversing the IGFET a very low output resistance (R) ranging from a few dozen to several hundred ohms.

Such low resistances are not only desirable but essential when an IGFET transistor is used to control the display device of a small portable instrument such as the dial of an electronic wristwatch for example, which can be powered by a weak battery of a few dozen to about 200 mAh. Such batteries are only a few millimeters in diameter and thickness, but nevertheless must afford sufficient power to run the wristwatch for a relatively long time, e.g. of the order of 15 months.

The current I which must be used in controlling a display device may be of several hundred μA. To satisfy the requirements of the display device, a pulse current must be applied with a pulse duration of 10 ms for example, and a frequency of one pulse per second. In this case the energy dissipated in the transistor controlling the display device is one-hundredth of that which will be given (for continuous current) by the well known equation $P = RI^2$, in which R is the output resistance of the transistor and I the current through it.

In order to insure the proper functioning of an instrument such as an electronic wristwatch for the desired length of time, the dissipated energy P must be limited to a particularly low value of the order of a few μW only. This means that the output resistance R of the transistor must be very low.

This resistance will be suitably low if the transistor is dimensioned in such manner that its transconductance slope K is high. It is well known that when a transistor operates below saturation, the value of its resistance R is, as a first approximation, given by the relation $$R \simeq 1/2K(V - V_T)$$

where
  K is the transconductance slope of the transistor in $A/V^2$,
  V is its gate voltage,
  $V_T$ is its threshold voltage.

However a transistor so dimensioned has a large area as compared to the area occupied on the same integrated circuit element (crystal) by the other transistors of the system, such as an oscillator circuit, a frequency-divider circuit, etc., in addition to the one or more control transistors for the display device. The entire system might be integrated for example on a single chip on which the increase in area made necessary by the presence of such control transistors might be of the order of 10 to 20% for each of these transistors. Such an increase in surface is naturally translated into a substantial increase in the manufacturing cost of the integrated circuit. This stems from the fact that a chip is cut out from a platelet, along with several others. The greater the area of a chip, the fewer of them will be cut from the same platelet and the greater will be the probability of manufacturing failures.

As can be seen from the relation above, it is also possible to obtain with an IGFET transistor a low output resistance by controlling it with a signal of high amplitude V. However, since the voltage of the miniature batteries mentioned above is of limited value, of the order of approximately 1.5 volts, this approach can be adopted only if a voltage multiplier is added to the system. This voltage multiplier will also have to be built in integrated form with very small components, in the manner described for instance in J. F. Dickson's article: "On-Chip High-Voltage Generation in MNOS Integrated circuits Using an Improved Voltage Multiplier Technique," *IEEE Journal of Solid State Circuits*, vol. SC-11, No. 3, June 1976, pp. 374–378.

If such a multiplier is to deliver a high voltage coupled with negligible energy consumption, it can only deliver a current of low intensity.

In addition, to control a display device with a pulse signal, it is necessary that the voltage supplied by the multiplier also come in the form of pulses applied to the control electrode of the transistor which controls the device in question. The multiplier must therefore be supplied with a current of an amplitude i which is determined by the well-known relation $$i = CVf$$

where
  C is the transistor gate capacitance,
  V is the triggering gate voltage,
  f is the gate voltage frequency.

The value of input capacitance in an IGFET transistor of not too large dimensions does not exceed a few pF. Since voltage V is conveniently chosen to be under 10 volts and since frequency f is of the order of 1 Hz, current i is in all cases less than 1 nA and therefore of negligible value. This is to say that the periodic charge and discharge of the gate of the transistor which controls the display device do not make it impossible to adopt the technique envisaged above.

However, this technique makes it necessary to have another device which can apply to the control electrode of the IGFET transistor the pulse signal supplied by the multiplier without loading this multiplier to the point of causing a considerable decrease in its output voltage. Thus, while receiving the multiplier output voltage without loading this multiplier unduly, and while being controlled by periodic signals of an amplitude at most equal to the amplitude of the battery voltage and of the frequency desired for the control of the IGFET transistor — for example, in the case of an electronic wristwatch, by signals coming from the frequency divider — this device must be able to produce high amplitude pulses, e.g. of the order of 5 to 6 volts from a battery voltage of about 1.5 volts, of the same duration as that required by the working characteristics of the display and of the same frequency as the said periodic signals.

OBJECT OF THE INVENTION

It is the object of the present invention to provide an improved, relatively small, low drain, electronic circuit for the production of signals of an amplitude greater than the amplitude of a given periodic signal for the purpose described.

SUMMARY OF THE INVENTION

For this purpose, the present invention provides an electronic device for the production of signals of an amplitude greater than the amplitude of a given periodic signal, the device comprising:

two supply terminals linked respectively to the first and second pole of a d-c voltage source of an amplitude at least equal to the one desired for the pulse signals, the first of these terminals being the common point of the circuit of the device;

a first input terminal connectible to a first source of periodic voltage producing signals with a period which is a submultiple of the duration of each one of the said pulse signals;

a second input terminal connectible to a second source of periodic voltage, this voltage being of the same frequency but phase-opposed to the one provided by the first periodic-voltage source;

a third input terminal receiving the said periodic signals;

an output terminal to which the said pulses are to be sent;

first and second IGFET charge transistors, each connected by one of its secondary electrodes to the said output terminal, and by the other secondary electrode to the second of said power terminals, the control electrode of the first and of the second charge transistors being respectively connected to the said first and second input terminals through respectively a first and a second coupling circuit, each of which includes at least one condenser connected by a plate (conductor) to the said control electrode;

first and second IGFET coupling transistors, both connected by the respective control electrodes to the said third input terminal, and by one of their secondary electrodes tied respectively to a plate of the condenser included in the first of said coupling circuits, and to a plate of the condenser included in the second of said coupling circuits, the other secondary electrode of both decoupling transistors being connected to a power source of the transistors;

first and second further IGFET transistors connected by one of their secondary electrodes to the output terminal, the other secondary electrode of both of the further transistors being connected respectively to the control electrode of the first and second charge transistors, the control electrodes of these two additional transistors being connected respectively to the control electrode of the second and first charge transistors;

at least one storage condenser inserted between a point of the circuit terminal tied to the output terminal and the first power terminal;

means for controlling the discharge of the capacitance associated with this point of the circuit during a specific no-signal period (dead time); and means for controlling the discharge of the capacitance associated with the circuit point to which the control electrode of each charge transistor is connected for at least part of the said no-signal period (dead time), all of the said transistors being of the same conduction type.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
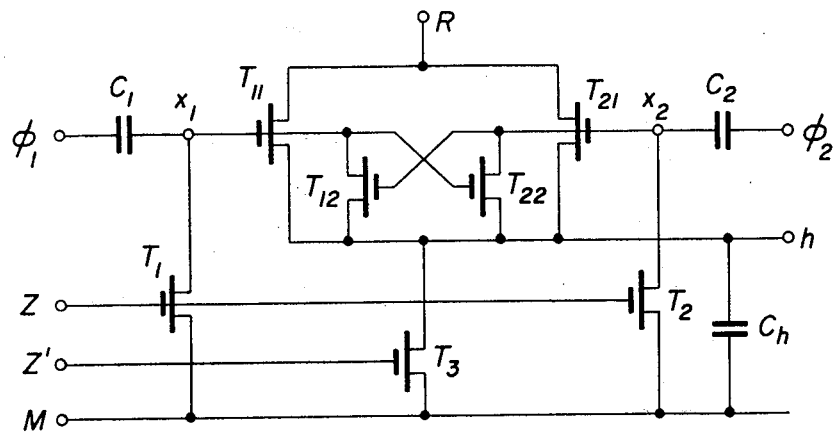
FIG. 1 is a circuit diagram of the first embodiment.

As can be seen from FIG. 1, the device in its first embodiment includes:

seven terminals M, R, $\Phi_1$, $\Phi_2$, Z, Z' and h, seven insulated-gate field-effect transistors $T_1$, $T_2$, $T_3$, $T_{11}$, $T_{12}$, $T_{21}$, $T_{22}$, and three condensers $C_1$, $C_2$, and $C_h$.

All the transistors, condensers, and connections of the device are integrated in a p-type crystal. The transistors and condensers are made of n-type zones and of metallic deposits separated from these zones by an insulating layer. In a modification, these zones could be p-type, and the crystal then would be of the n-type.

Terminals M and R are the power terminals of the device, to be connected respectively to the first and to the second poles of a source of a d-c current, not shown. Terminal M is the common point of the device. The source may be, for example, of the kind described by J. F. Dickson (op. cit.) or of another similar type.

Figure 2:
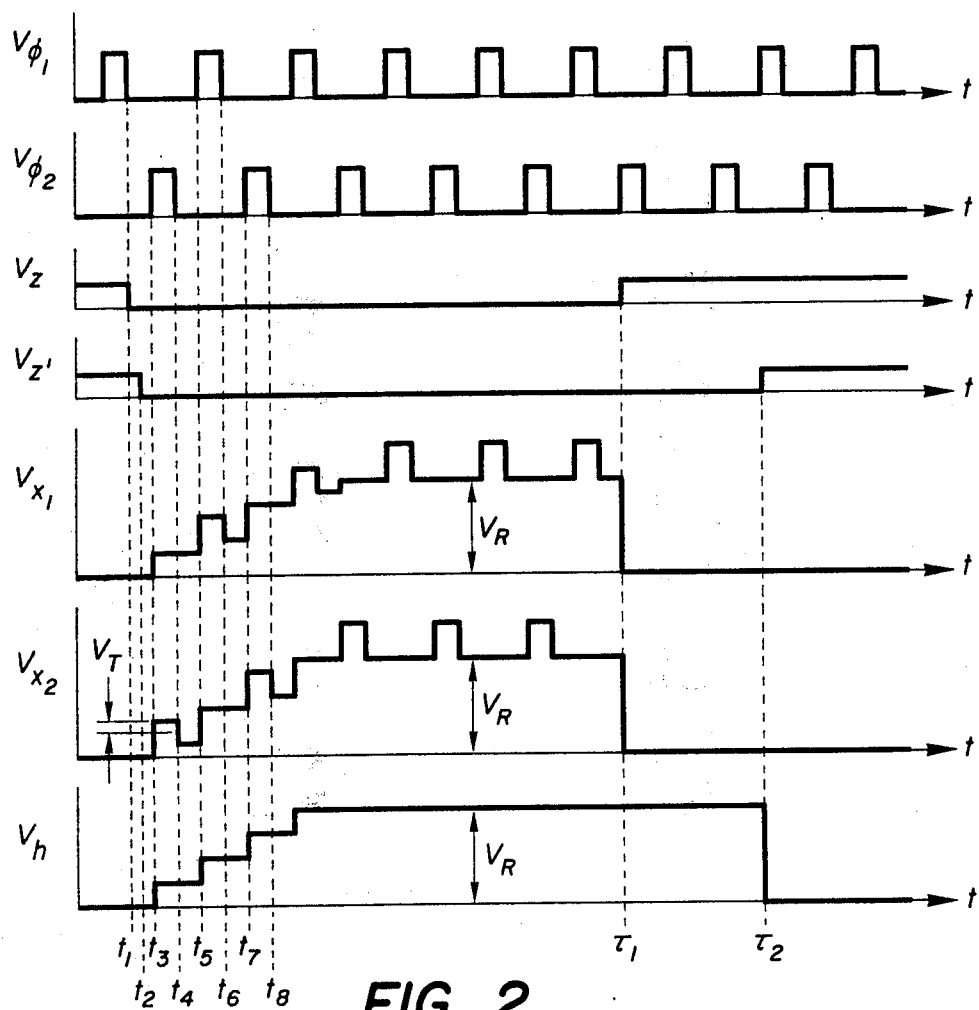
FIG. 2 is a set of graphs which show variations with time (abscissa) of the potential (ordinate) appearing at various points of the circuit of FIG. 1.

Terminals $\Phi_1$ and $\Phi_2$ are to be respectively connected to a first and second source (not shown) of periodic voltage sending voltage pulses $V_{\Phi_1}$ and $V_{\Phi_2}$, respectively (FIG. 2). It will be noted that pulses $V_{\Phi_1}$ and $V_{\Phi_2}$ are phase-opposed (FIG. 2), i.e. 180° out of phase with each other.

Terminal Z is connected to a source, not shown, of voltage pulse signals $V_Z$ (FIG. 2) which have a lower frequency than pulse signals $V_{\Phi_1}$ and $V_{\Phi_2}$.

It is these pulse signals $V_Z$ which control the device according to the invention to form pulses $V_h$ of the desired higher amplitude, these pulses $V_h$ being sent to terminal h (signal $V_h$ in FIG. 2).

Terminal Z' is to be connected to an auxiliary source of voltage producing a signal $V_{Z'}$ during at least a fraction of the time included between the instant when a pulse signal appears at terminal Z and the instant when the first pulse of signal $V_{\Phi_1}$, $V_{\Phi_2}$ appears at terminal $\Phi_1$ or $\Phi_2$ after the decay of signal $V_Z$.

It will be noted finally that in all cases, the amplitude of the d-c current supplied by the source to which terminals M and R are to be connected will be chosen to be at least equal to the amplitude desired for the pulses which are to be sent to terminal $h$.

Transistor $T_1$ is serially connected with the coupling condenser $C_1$ at a point $X_1$ between terminal M and terminal $\Phi_1$. Transistor $T_2$ is serially connected with the coupling condenser $C_2$ at a point $X_2$ between terminal M and terminal $\Phi_2$. The respective control electrodes of transistors $T_1$ and $T_2$ are connected to the same terminal Z already mentioned. Point $X_1$ is connected to the control electrodes of transistors $T_{11}$ and $T_{22}$. Similarly, point $X_2$ is connected to the respective control electrodes of transistors $T_{21}$ and $T_{12}$.

Transistors $T_{11}$ and $T_{21}$ are connected by one of their respective secondary electrodes to terminal R, and by their respective second secondary electrodes to terminal $h$. Transistor $T_{12}$ is connected by one of its secondary electrodes to the same terminal $h$, and by its other secondary electrodes to the control electrode of transistor $T_{11}$. Transistor $T_{22}$ is connected by one of its secondary electrodes to terminal $h$, and by the other secondary electrode to the control electrode of transistor $T_{21}$. The control electrode of transistor $T_{12}$ is connected to the control electrode of transistor $T_{21}$. The control electrode of transistor $T_{22}$ is connected to the control electrode of transistor $T_{11}$.

Transistor $T_3$ is connected by one of its secondary electrodes to terminal $h$, and to terminal M by the other. The insulated gate of this transistor $T_3$ is connected to terminal Z' already mentioned.

Condenser $C_h$ is used for charge storage. It is inserted between terminals $h$ and M of the circuit.

It is to be noted that the capacitance of this condenser $C_h$ will be chosen conveniently to be much higher than those of coupling condensers $C_1$ and $C_2$. Of course, the value of this capacitance $C_h$ will be chosen in dependence upon the value of the circuit input capacitance which is to be connected to terminal $h$ since it is being fed by the pulses sent to that terminal.

The functioning of the circuit will now be described with reference to FIG. 2.

Before instant $t_1$, i.e. when terminals Z and Z', respectively, stop receiving a pulse signal $V_Z$ and a pulse signal $V'_Z$, transistors $T_1$, $T_2$, and $T_3$ are open (conductive) while all the other transistors are blocked. Condenser $C_h$ is discharged and the potentials at points $X_1$, $X_2$, and $h$ of the circuit (see $V_{X_1}$, $V_{X_2}$, and $V_h$ in FIG. 2) are nonexistent, i.e. null or zero valued.

At instant $t = t_1$, potential $V_Z$ at terminal Z tends to vanish while potential $V'_Z$ at terminal Z' subsists. It follows from this that transistors $T_1$ and $T_2$ become blocked while transistor $T_3$ still remains open. Transistors $T_{11}$, $T_{12}$, $T_{21}$, and $T_{22}$ remain blocked since the potentials at points $X_1$ and $X_2$ are still zero.

At instant $t = t_2$, potential $V'_Z$ at terminal Z' vanishes and transistor $T_3$ becomes blocked.

At instant $t = t_3$, i.e. the instant when the first pulse of signal $V_{\Phi_2}$ appears after signal $V'_Z$ vanishes, potential $V_{X_2}$ at point $X_2$ increases by a quantity $\Delta V_{X_2}$. As soon as its value rises above the threshold voltage $V_T$ of the transistors of the device, transistor $T_{21}$ opens. Potential $V_h$ at terminal $h$ becomes $V_h(t_3) = \Delta V_{X_2} - V_T$. Concurrently, transistor $T_{12}$ opens also, so that the potential at point $X_1$ grows approximately to the value $V_h$.

At instant $t = t_4$, i.e. at the moment when signal $V_{\Phi_2}$ has again vanished and when signal $V_{X_2}$ tends towards zero, transistor $T_{22}$ opens as soon as the difference in potential at points $X_1$ and $X_2$, $V_{X_1} - V_{X_2}$, becomes at least equal to the threshold voltage $V_T$ of the transistor. Consequently, the charge accumulated in condensors $C_h$ and $C_1$ is distributed between them and condenser $C_2$. Since the value of the charge in condenser $C_h$ is much higher than that in condenser $C_1$ and condenser $C_2$, the value of the potential $V_{X_2}$ at point $X_2$ becomes $V_{X_2}(t_4) \simeq V_h(t_3) - V_T$ while the value of potential $V_{X_1}$ and $V_h$ at points $X_1$ and $h$ remains approximately equal to $V_h(t_3)$.

At instant $t = t_5$, i.e. at the moment of arrival of the first pulse of signal $V_h$ after potential $V'_Z$ has vanished, potential $V_{X_1}$ at point $X_1$ increases by a quantity $\Delta V_{X_1}$, similar to the increase in potential $V_{X_2}$ at instant $t_3$. This increase in potential adds itself to potential $V_h(t_3)$ which existed at point $X_1$ before instant $t_5$. The result is that transistor $T_{11}$ opens and that condenser $C_h$ becomes charged so that potential $V_h$ at point $h$ becomes equal to $V_h(t_5) = V_h(t_3) + \Delta V_{X_1} - V_T$. Transistor $T_{22}$ opens also and potential $V_{X_2}$ at point $X_2$ takes on the value of potential $V_h$.

At instant $t = t_6$, potential $V_{\Phi_1}$ tends towards zero. As soon as the difference in potential $V_{X_2} - V_{X_1}$ becomes at least equal to the threshold voltage $V_T$ of transistor $T_{12}$, this transistor opens and the accumulated charge in condensers $C_h$ and $C_2$ is distributed between these condensers and condenser $C_1$ without the potential of point $h$ and of point X varying in any noticeable way.

Instant $t = t_7$ coincides with the moment when the next pulse of signal $V_{\Phi_2}$ arrives. The process which ensues is in all ways similar to the one which took place with the arrival of a pulse $V_{\Phi_2}$ at instant $t_3$ at terminal $\Phi_2$, i.e. potential $V_h$ increases again by a quantity $\Delta V_{X_1} - V_T$.

It can be seen from the foregoing and by referring to FIG. 2 that, as pulses $V_{\Phi_1}$ and $V_{\Phi_2}$ arrive at terminals $\Phi_1$ and $\Phi_2$, voltage $V_h$ at terminal $h$ rises up to the moment it reaches its maximum value which is more or less equal to voltage $V_R$ of the of the source of d-c current to which are tied the terminals R and M of the device. From that moment on, potential $V_h$ keeps its value $V_h = V_R$ until the arrival of a pulse $V_Z$ at instant $t_1$ at terminal Z of the device.

At that instant $t = \tau_1$, transistors $T_1$ and $T_2$ become conductive so that the potential at points $X_1$ and $X_2$ disappears.

At instant $t = \tau_2$, which is the instant when signal $V'_Z$ reappears at terminal Z', it is transistor T which becomes conductive and the potential $V_h$ at point $h$ vanishes. The device then finds itself in the state it was in before instant $t = t_1$ and ready to send a new pulse to terminal $h$.

Figure 3:
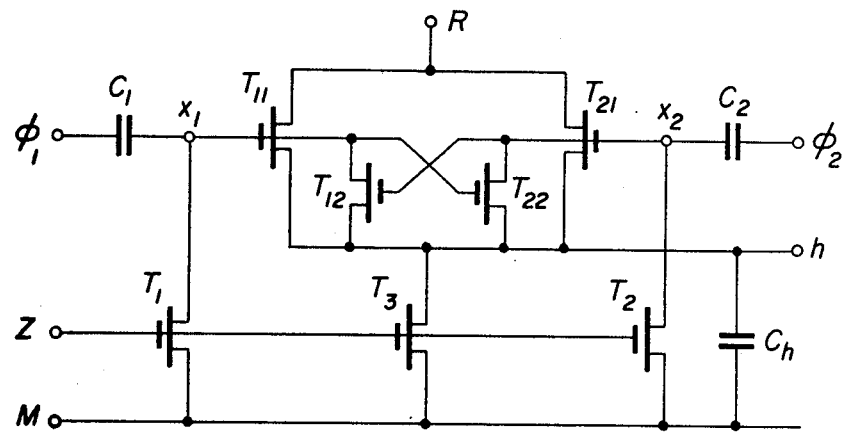
FIG. 3 is a circuit diagram of a first modification of the first embodiment.

According to a first modification (FIG. 3), transistor $T_3$ is connected by its gate lead to terminal Z, as are also transistors $T_1$ and $T_2$. Then, the potentials at points $X_1$ and $X_2$ and at the terminal $h$ disappear simultaneously.

Figure 4:
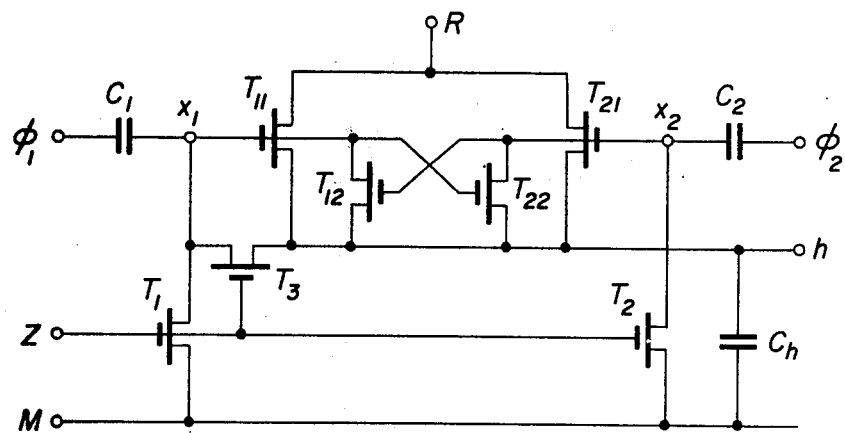
FIG. 4 is another circuit diagram of a second modification, similar to the one in FIG. 3.

According to a second modification (FIG. 4), transistor $T_3$ is connected by one of its secondary electrodes to terminal $h$, by its other secondary electrode to a point in the circuit between transistor $T_1$ and condenser $C_1$, and by its control electrode to terminal Z to which are also tied the control electrodes of transistors $T_1$ and $T_2$.

Figure 5:
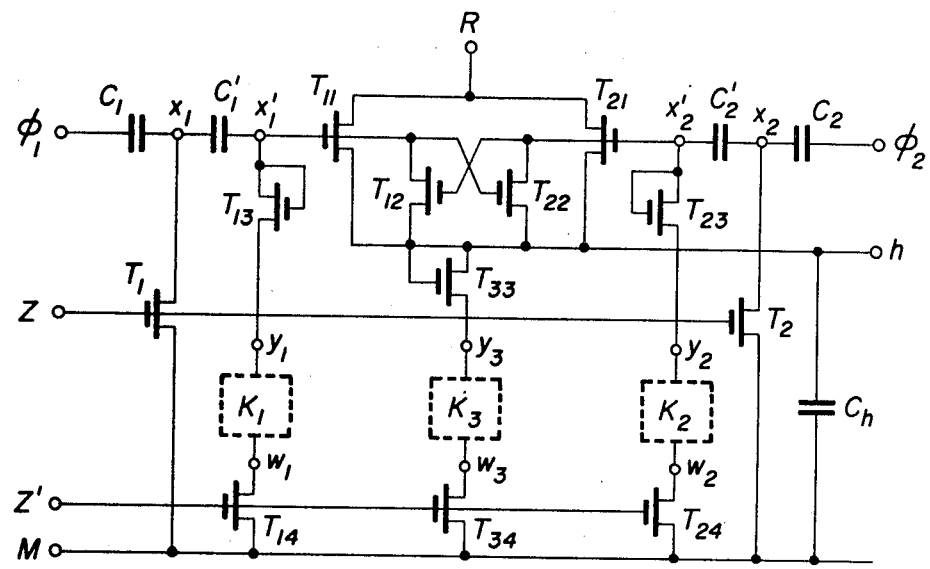
FIG. 5 is a circuit diagram of the second embodiment.
Figure 6:
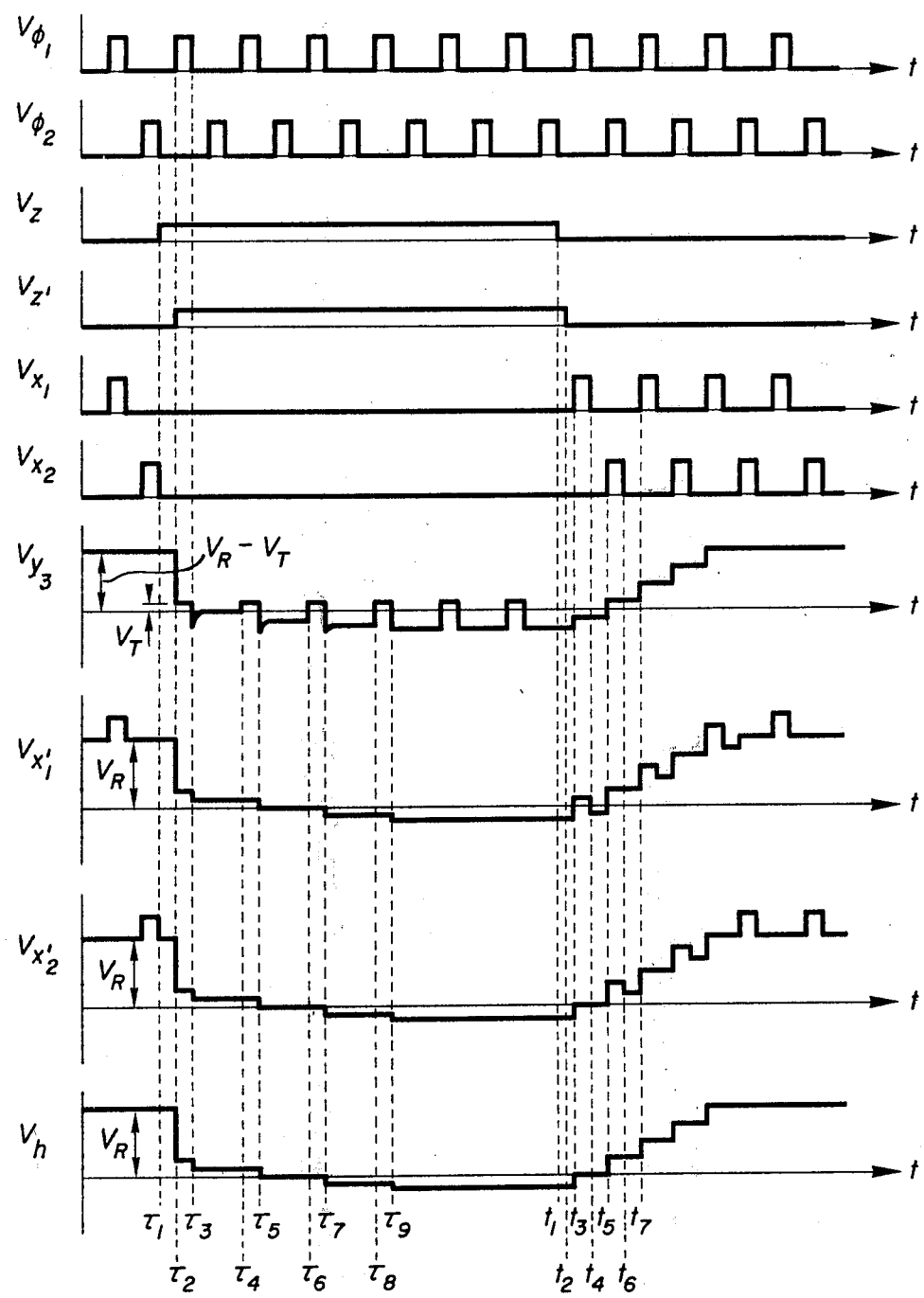
FIG. 6 is a set of graphs which show variations with time (abscissa) of the potentials (ordinate) appearing at various points of the circuit of FIG. 5.

The second embodiment of the device in accordance with the present invention (FIG. 5) makes it possible to obtain at terminal $h$ a potential which goes cyclically positive and negative (potential $V_h$ in FIG. 6).

Figure 7:
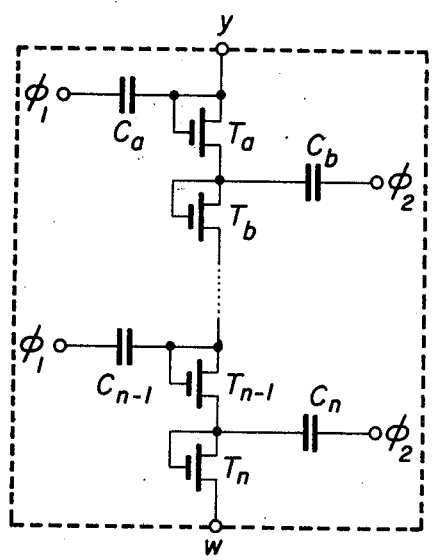
FIG. 7 is a detail of part of the circuit shown in FIG. 5.

As can be seen from FIG. 5, this circuit includes:

seven terminals M, R, $\Phi_1$, $\Phi_2$, Z, Z', and h, twelve insulated-gate field-effect (IGFET) transistors $T_1$, $T_2$, $T_{11}$, $T_{12}$, $T_{13}$, $T_{14}$, $T_{21}$, $T_{22}$, $T_{23}$, $T_{24}$, $T_{33}$, and $T_{34}$, five condensers $C_1$, $C'_1$, $C_2$, $C'_2$, and $C_h$, three circuits $K_1$, $K_2$, and $K_3$ shown in detail in FIG. 7, each including a plurality of insulated-gate field-effect (IGFET) transistors $T_a$, $T_b$, ..., $T_{n-1}$, $T_n$ as well as an equal number of condensers $C_a$, $C_b$, ..., $C_{n-1}$, $C_n$.

Here also, all transistors, condensers and circuitry are integrated in a p-type crystal, transistors and condensers being made up by n-type zones and metallic deposits separated from the zones by an insulating layer. In a modification, these zones could be p-type, the crystal then would be n-type.

The seven terminals already mentioned are identical with those which appear in FIG. 1. With the exception of terminal h, they are also connected to voltage sources, not shown, with characteristics similar to those already cited in the context of FIG. 1. In this connection the shapes of signals $V_{\Phi_1}$, $V_{\Phi_2}$, $V_Z$, $V'_Z$ as they appear in FIGS. 2 and 6 are comparable.

Transistor T is inserted between terminal M and the tie point of two condensers $C_1$ and $C'_1$, the first of which is connected to terminal $\Phi_1$ and the second ($C'_1$) to the control electrode of transistor $T_{11}$. Transistor $T_2$ is inserted between terminals M and and the tie point of two condensers $C_2$ and $C'_2$, the first of which ($C_2$) is connected to terminal $\Phi_2$, while the second ($C'_2$) is connected to the control electrode of transistor $T_{21}$. Condensers $C_1$ and $C'_1$ form thus a coupling circuit for transistor $T_{11}$, and condensers $C_2$ and $C'_2$ form another coupling circuit for transistor $T_{21}$.

Transistors $T_1$ and $T_2$ are both connected by their control electrode to terminal Z. The two transistors $T_{11}$ and $T_{21}$ are connected, by one of their secondary electrodes to terminal R and by the other secondary electrode to terminal h.

Transistors $T_{12}$ and $T_{22}$ are connected by one of their secondary electrodes to the already mentioned terminal h. Transistor $T_{12}$ is tied by its other secondary electrode to the control electrode of transistor $T_{11}$, and transistor $T_{22}$ is connected by its second secondary electrodes to the control electrode of transistor $T_{21}$. The control electrode of transistor $T_{12}$ is connected to the control electrode of transistor $T_{21}$. Similarly, the control electrode of transistor $T_{22}$ is connected to the control electrode of transistor $T_{11}$.

As can be seen from FIG. 5, points $X'_1$ and $X'_2$ of the circuit as well as terminal h are also connected to the terminal M as follows:

$X'_1$ through a first transistor $T_{13}$, a second transistor $T_{14}$, a circuit $K_1$ inserted between these two transistors, in series with their secondary electrodes;

$X'_2$ through a first transistor $T_{23}$, a second transistor $T_{24}$, and a circuit $K_2$ inserted between these two transistors, in series with their secondary electrodes;

and h through a first transistor $T_{33}$, a second transistor $T_{34}$, and a circuit $K_3$ inserted between these two transistors, in series with their secondary electrodes.

The transistors of the first set $T_{13}$, $T_{23}$, $T_{33}$ have their control electrodes connected in each case to their own secondary electrode which also connects them respectively to points $X'_1$, $X'_2$ and terminal h. These three transistors $T_{13}$, $T_{23}$, and $T_{33}$ are therefore wired as diodes.

The transistors of the second set, $T_{14}$, $T_{24}$, $T_{34}$, are connected by their control electrodes to terminal Z' already mentioned.

As concerns the K-type circuits, reference is made to FIG. 7 for the details.

It will be noted that between terminals y and w ($y_1$ and $w_1$ for circuit $K_1$; $y_2$ and $w_2$ for circuit $K_2$; $y_3$ and $w_3$ for circuit $K_3$ in FIG. 5), this circuit includes n transistors $T_a$, $T_b$, ... $T_n$, connected in series through their respective secondary electrodes and whose respective control electrode are tied, for each transistor, to the secondary electrode of the transistor which is closest to terminal y. With each transistor $T_a$, $T_b$, ..., $T_{n-1}$, $T_n$ a corresponding condenser $C_a$, $C_b$, ... $C_{n-1}$, $C_n$ is associated and connected respectively by one of its plates to the control electrode of the corresponding transistor, and by the other plate to terminals $\Phi_1$ and $\Phi_2$, alternatively from condenser to condenser.

Condenser $C_h$, which is connected between terminals h and M is used for charge storage. It must be pointed out that the capacitance of this condenser will be conveniently chosen to be of a value much greater than that of the other condensers of the device. This value is, of course, a function of the input capacitance of the circuit to be connected to terminal h.

The functioning of the device illustrated in FIGS. 5 and 7 is now going to be described in reference to FIG. 6 and for the case when circuits $K_1$, $K_2$ and $K_3$ each include only a single transistor and a single condenser, namely transistor $T_a$ and condenser $C_a$.

It will be noted first that the potential at points h ($V_h$), $X'_1 (V_{X'_1})$ and $X'_2 (V_{X'_2})$ of the circuit at a time prior to instant $t = \tau_1$ was obtained in a manner similar to the one which has been described previously in reference to FIG. 1; for further details, therefore, refer back to the pertinent passages which fit the present description.

Before instant $t = \tau_1$ the potential at points Z, ($V_Z$) and Z' ($V'_Z$) being zero, transistors $T_1$, $T_2$, $T_{14}$ and $T_{34}$ are blocked and the potential at terminal h ($V_h$), is practically equal to the potential at terminal R ($V_R$), while transistors $T_{11}$ and $T_{21}$ are periodically open.

Still before instant $t = \tau_1$, the potential at points $X_1$ and $X_2$ acquires a periodic shape. At points $y_1$, $y_2$, and $y_3$, the potential is respectively equal to $V'_{X_1} - V_T$, $V'_{X_2} - V_T$, and $V_h - V_T$. Transistors $T_{12}$ and $T_{22}$ are periodically open but are no longer active.

At instant $t = \tau_1$ the potential at terminal Z becomes $V_Z$. It follows that transistors $T_1$ and $T_2$ open and that the potentials at points $X_1$ and $X_2$ ($V_{X_1}$ and $V_{X_2}$) become nonexistent beginning with that moment. No signal pulse $V_{\Phi_1}$ and $V_{\Phi_2}$ can therefore influence the state of the device.

At instant $t = \tau_2$, the potential $V'_Z$ appears at terminal Z' and transistors $T_{14}$, $T_{24}$, and $T_{34}$ open. It follows that potential $V_{y_1}$ at point $y_1$, potential $V_{y_2}$ at point $y_2$, potential $V_{y_3}$ at point $y_3$, fall to a value corresponding to the threshold voltage $V_T$ of transistors $T_a$. Since transistors $T_{13}$, $T_{23}$, and $T_{33}$ become active, the value of the potentials at points $X'_1$, $X'_2$ as well as at terminal h will be equal to $2V_T$.

At instant $t = \tau_3$, signal $V_{\Phi_1}$ becomes zero again so that the potential at point y of every K-circuit tends to go negative. Since the potential at point y of every K-circuit becomes thus more negative than the value of threshold voltage $V_T$, transistors $T_{13}$, $T_{33}$, $T_{23}$, open so that a transfer of charge is obtained from condenser $C'_1$ toward point $y_1$, from condenser $C'_2$, toward point $y_2$ and from condenser $C_h$ toward point $y_3$. From these charge transfers, there results a drop in the value of the voltage at points $X'_1$, $X'_2$, and at terminal $h$, while the values of the potentials at $y_1$, $y_2$, and $y_3$ rise again.

At instant $t = \tau_4$ potential $V_{\Phi_1}$ grows. The potentials at points $y_1$, $y_2$, and $y_3$ cannot however go beyond the threshold voltage of transistors $T_{a1}$, $T_{a2}$, and $T_{a3}$ of circuits $K_1$, $K_2$, and $K_3$.

At instant $t = \tau_5$, potential $V_{\Phi_1}$ falls back again to zero and the potentials at points $y_1$, $y_2$, and $y_3$ go negative again according to a process similar to the one at work at instant $\tau_3$. As soon as these potentials become respectively more negative than $V'_{X_1} - V_T$, $V'_{X_2} - V_T$, and $V_h - V_T$, transistors $T_{13}$, $T_{23}$, and $T_{33}$ open so that part of the stored up charges in condensers $C'_1$, $C'_2$ and $C_h$ are again brought toward points $y_1$, $y_2$, and $y_3$.

It follows that the values of the potentials at points $X'_1 (V'_{X_1})$, $X'_2 (V'_{X_2})$ and at terminal $h$ ($V_h$) drop by one step every time that voltage $V_{\Phi}$ drops back to zero, until the negative voltages created at points $y_1$, $y_2$ and $y_3$ are no longer able to open transistors $T_{13}$, $T_{23}$, and $T_{33}$ (which is what happens for $t > \tau_g$). These negative voltages endure until the disappearance of pulses $V_Z$ and $V'_Z$.

The functioning of the device between instants $t_1$ and $t_7$ is similar to the functioning of the device in FIG. 1. It will be noted that the increases in potential at the respective control electrodes of transistors $T_{11}$ and $T_{12}$ and at terminal $h$ begin with a negative value.

The first and second modifications of the device being the substance of the second embodiment of the invention (FIGS. 8 and 9), they make it possible to obtain at terminal $h$ a potential which becomes cyclically positive and negative, as in the embodiment in FIG. 5, but with fewer electronic components.

In the first modification (FIG. 8), the device includes:
six terminals M, R, $\Phi_1$, $\Phi_2$, Z, and $h$,
ten insulated-gate field-effect transistors (IGFET) $T_1$, $T_2$, $T_3$, $T_{11}$, $T_{12}$, $T_{13}$, $T_{21}$, $T_{22}$, $T_{23}$, $T_{33}$,
five condensers $C_1$, $C'_1$, $C_2$, $C'_2$, and $C_h$,
a K-circuit of the kind illustrated in FIG. 7, containing a plurality of insulated-gate field-effect transistors (IGFET) $T_a$, $T_b$, ... $T_{n-1}$, $T_n$ as well as a corresponding number of condensers $C_a$, $C_b$, ... $C_{n-1}$, $C_n$.

All the transistors, condensers and circuits of the device are integrated in a p-type crystal, transistors and condensers being made up of n-type zones and metallic deposits separated from these zones by an insulating layer.

In a modification, these zones could be p-type, the crystal being then n-type.

Terminals $\Phi_1$ and $\Phi_2$ are wired to a first and second source (not shown) of periodic phase-opposed voltage.

Terminal Z is wired to a source (not shown of pulse signals of a frequency lower than the frequency of the input pulse signals at terminals $\Phi_1$ and $\Phi_2$.

Terminal $h$ is the output terminal of the device, to which the desired higher voltage pulses are to be brought.

Terminals M and R are the power terminals of the device, wired respectively to the first and second poles of a source, of dc current, not shown. Terminal M constitutes the common point of the device. The source could be of the kind described in the previously mentioned article by J. F. Dickson.

The general shape of the signals sent by these different sources corresponds to those shown in FIGS. 2 and 6 already described.

Figure 8:
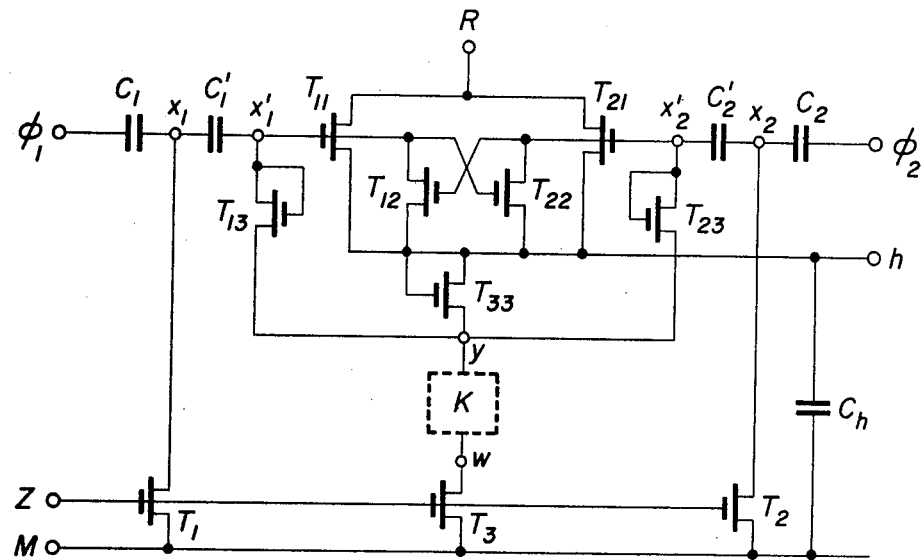
FIGS. 8 and 9 are the circuit diagrams of a first and second modification, respectively, of the second embodiment.

As can be seen in FIG. 8, the device also has two coupling circuits made up of pairs of condensers $C_1$, $C'_1$, and $C_2$, $C'_2$, the first circuit being located between terminal $\Phi_1$ and the control electrode of transistor $T_{11}$, and the second between terminal $\Phi_2$ and the control electrode of transistor $T_{21}$. Transistors $T_1$ and $T_2$ are respectively connected between terminal M and the tying point $X_1$ of condensers $C_1$ and $C'_1$, and between terminal M and the tying point $X_2$ of condensers $C_2$ and $C'_2$. Transistors $T_1$ and $T_2$ are also connected by their respective control electrodes to terminal Z already mentioned. The two transistors $T_{11}$ and $T_{21}$ are connected by one of their respective secondary electrodes to terminal R, and by their other respective secondary electrodes to terminal $h$.

Transistors $T_{12}$ and $T_{22}$ are also connected to terminal $h$ by one of their respective secondary electrodes, and by their other respective secondary electrodes to the control electrodes of transistors $T_{11}$ and $T_{21}$ respectively.

The control electrode of transistor $T_{12}$ is connected to the control electrode of transistor $T_{21}$. The control electrode of transistor $T_{22}$ is connected to the control electrode of transistor $T_{11}$.

Points $X'_1$ and $X'_2$ and terminal $h$ are connected to point $y$ through transistors $T_{13}$, $T_{23}$ and $T_{33}$ respectively.

The control electrode of transistor $T_{13}$ is connected to point $X'_1$, the control electrode of transistor $T_{23}$ to point $X'_2$, and the control electrode of transistor $T_{33}$ to terminal $h$. These three transistors are therefore wired as diodes.

Finally, point $y$ is connected to terminal M through a K-circuit (FIG. 7) and a transistor $T_3$ whose control electrode is connected to terminal Z. The respective control electrodes of transistors $T_1$ and $T_2$ are also connected to terminal Z.

The K-circuit may have only a single transistor $T_a$ and a single condenser $C_a$ or several, according to the amplitude desired for the ac voltage at terminal $h$.

Condenser $C_h$, which is inserted between terminals $h$ and M, is used for charge storage. It should be mentioned that the capacitance of this condenser will be conveniently chosen to be of a value far superior to that of the capacitances of the other condensers of the device. Furthermore, this value will be chosen as a function of the input capacitance of the circuit to be connected to terminal $h$.

The device which has just been described works along the same general lines as the device represented in FIG. 5. For further details, therefore, refer back to the pertinent parts of the description.

Figure 9:
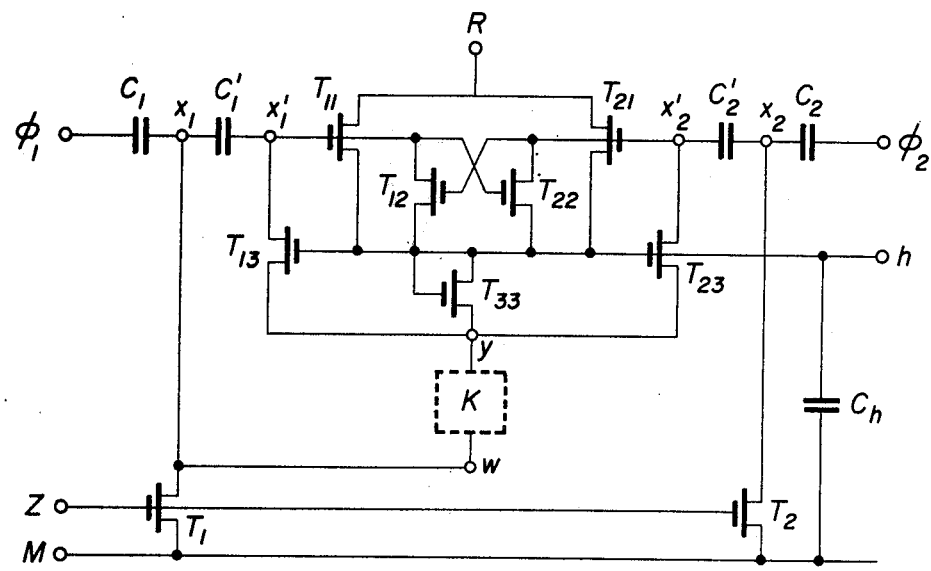

In the modification of FIG. 9, the device includes
six terminals M, R, $\Phi_1$, $\Phi_2$, Z, and $h$,
nine insulated-gate field-effect (IGFET) transistors $T_1$, $T_2$, $T_{11}$, $T_{12}$, $T_{13}$, $T_{21}$, $T_{22}$, $T_{23}$ and $T_{33}$,
five condensers $C_1$, $C'_1$, $C_2$, $C'_2$, and $C_h$,
a K-circuit of the kind illustrated in FIG. 7, capable of including a plurality of insulated-gate field-effect transistors (IGFET), $T_a$, $T_b$, ... $T_{n-1}$, $T_n$ as well as a corresponding number of condensers $C_a$, $C_b$, ... $C_{n-1}$, $C_n$.

All transistors, condensers, and circuit connections are integrated in a p-type crystal, the transistors and the condensers being made up of n-type zones and metallic deposits separated from these zones by an insulating layer.

As a modification, these zones could be p-type, the crystal then being n-type.

The various terminals of the device are to receive signals which are identical with those to be received by the corresponding terminals of the modified circuit of the device represented in FIG. 8. Refer back therefore to the pertinent part of the description for that FIG. 8 for more details.

It will also be noted that the arrangement and the function of many of the electronic components of the circuit are identical with those contained in the circuit of the device drawn in FIG. 8. This is the case of transistors $T_1$, $T_2$, $T_{11}$, $T_{12}$, $T_{21}$, $T_{22}$, and $T_{33}$ as well as for condensers $C_1$, $C'_1$, $C_2$, $C'_2$, and $C_h$.

The structural difference are essentially limited to the level of the chosen couplings for transistors $T_{13}$ and $T_{23}$ and for the K-circuit. Transistor $T_{13}$ is connected by a secondary electrode to point $X'_1$, by its other secondary electrode to point $y$, and by its control electrode to terminal $h$. Similarly, transistor $T_{23}$ is connected by a secondary electrode to point $X'_2$, by its other secondary electrode to point $y$, and by its control electrode to terminal $h$. The K-circuit may include any number of transistors $T_a$, $T_b$, ... $T_{n-1}$, $T_n$ with which corresponding condensers $C_a$, $C_b$, ... $C_{n-1}$, $C_n$ are associated in numbers which depend on the amplitude desired for the periodic voltage at terminal $h$. The K-circuit is connected between point $y$ and point $X_1$, the typing point of the two condensers $C_1$ and $C'_1$.

Figure 12:
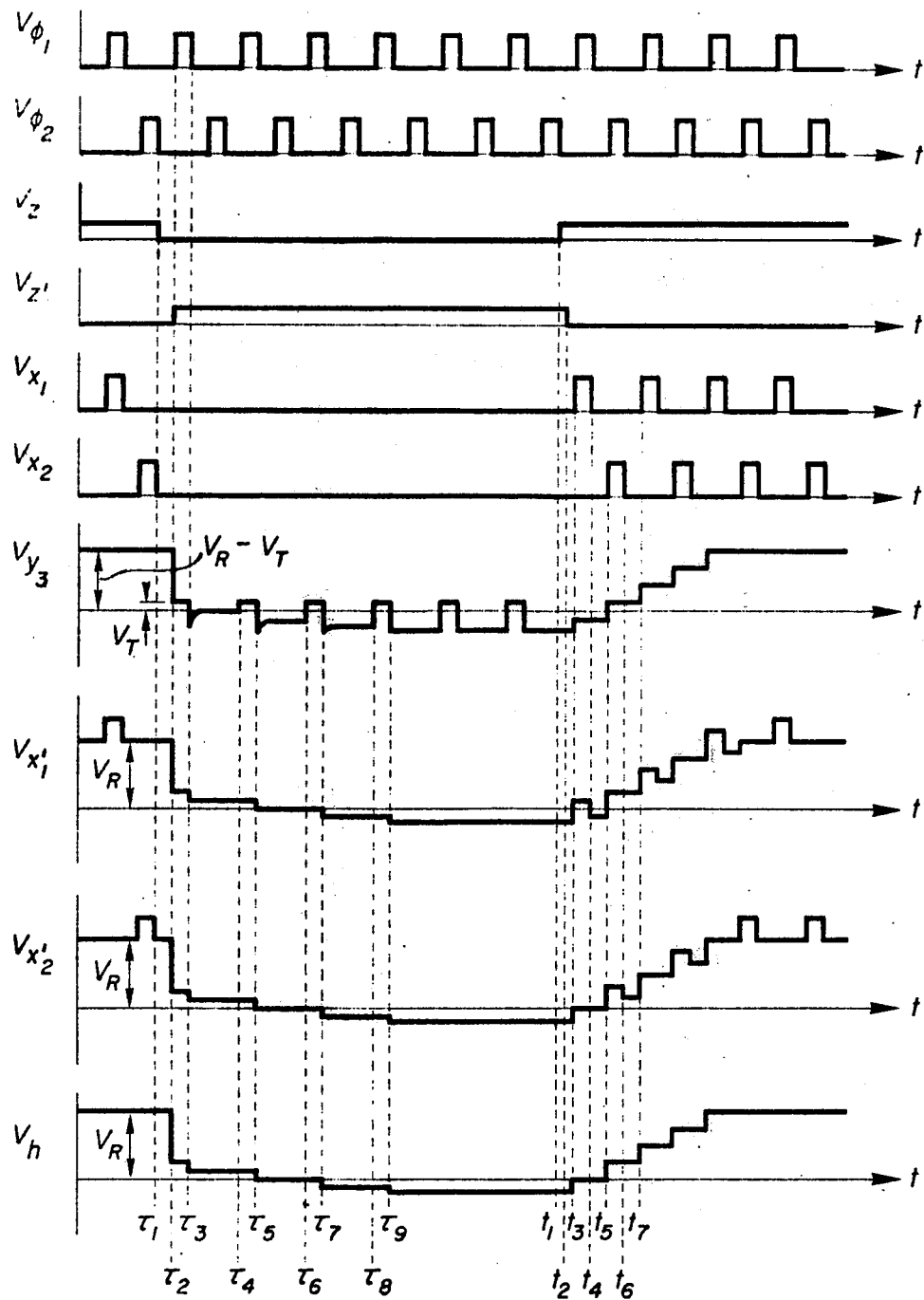
FIG. 12 is a set of graphs which show variation with time (abscissa) of the potentials (ordinate) appearing at various points of the diagram in FIG. 10.

The third embodiment of the device according to the invention (FIG. 10) makes is possible, as in the embodiments drawn in FIGS. 5, 8, and 9, to obtain on terminal $h$ a potential which goes cyclically positive and negative (potential $V_h$ in FIG. 12).

In the drawing, this device includes
seven terminals M, R, $\Phi_1$, $\Phi_2$, Z, Z', and $h$,
twelve insulated-gate field-effect (IGFET) transistors $T_1$, $T_2$, $T_{11}$, $T_{12}$, $T_{13}$, $T_{14}$, $T_{21}$, $T_{22}$, $T_{23}$, $T_{24}$, $T_{33}$, $T_{34}$,
three condensers $C_1$, $C_2$, $C_h$,
three circuits $K_1$, $K_2$, $K_3$ drawn in detail in FIG. 7, each including a number of insulated-gate field-effect transistors (IGFET) $T_a$, $T_b$, ... $T_{n-1}$, $T_n$ as well as a corresponding number of condensers $C_a$, $C_b$, ... $C_{n-1}$, $C_n$.

All the transistors, condensers and circuit connections are integrated in a p-type crystal, the transistors and condensers being made up of n-type zones and of metallic deposits separated from these zones by an insulating layer. As a modification, these zones could be p-type, the crystal then being n-type.

The seven terminals already mentioned correspond to identical terminals appearing in the embodiment of FIG. 5. With the exception of terminal $h$, they are also to be connected to voltage sources, not shows, supplying periodic signals with characteristics similar to those mentioned in the context of FIG. 5, except for terminal Z' which is to be powered by signals $V'_z$ appearing periodically when signals $V_z$ at terminal Z disappear and the first pulse signal $V_{\Phi_1}$ appears following the vanishing of each signal $V_z$. FIGS. 6 and 12 are to be compared in this connection.

Figure 10:
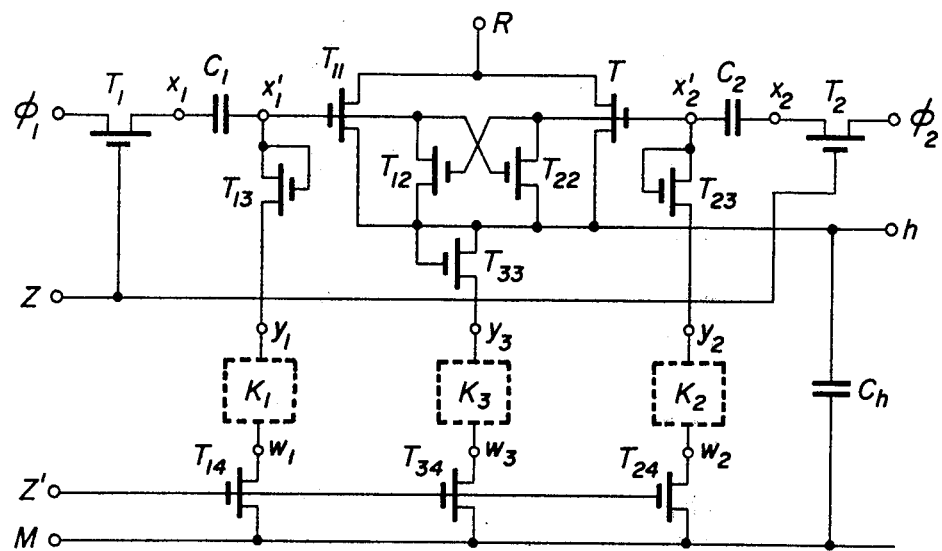
FIG. 10 is a circuit diagram of a third embodiment.

As can be seen in FIG. 10, transistor $T_1$ is connected between terminal $\Phi_1$ and a plate of condenser $C_1$ whose other plate is connected to the control electrode of transistor $T_{11}$. Similarly, transistor $T_2$ is connected between terminal $\Phi_2$ and a plate of condenser $C_2$ whose other plate is connected to the control electrode of transistor $T_{21}$. Transistor $T_1$ and condenser $C_1$ on the one hand, and transistor $T_2$ and condenser $C_2$ on the other make up the coupling circuits for transistor $T_{11}$ and transistor $T_{21}$ respectively. Transistors $T_1$ and $T_2$ are both connected by their control electrode to terminal Z.

The other elements of the circuit of the device drawn in this FIG. 10 are identical in all respects, as concerns their nature and arrangement, with similar elements of the device in FIG. 5 Refer back therefore to the pertinent parts of the description for FIG. 5 for more details.

The device in this third embodiment differs slightly from the device in FIG. 5 in its manner of functioning as will be apparent.

Each of the K-circuits $K_1$, $K_2$ and $K_3$ includes only a single transistor and a single condenser, namely transistor $T_a$ and condenser $C_a$. The potentials at points $h$ ($V_h$), $X'_1$, ($V_{X'_1}$) and $X'_2$ ($V_{X'_2}$) at a time prior to instant $t = \tau_1$ were obtained in a manner similar to the one described already in reference to FIG. 1. For more details, refer back to the pertinent parts of that description.

Before instant $t = \tau_1$, the potential at terminal Z = $V_z$ and the potential at terminal Z' = 0. Transistors $T_1$ and $T_2$ are therefore open, transistors $T_{14}$, $T_{34}$ and $T_{24}$ are blocked. The potential $V_h$ at terminal $h$ is practically equal to potential $V_R$ at terminal R, while transistors $T_{11}$ and $T_{21}$ are periodically open.

Before instant $t = \tau_1$, moreover, the potentials at points $X_1$ and $X_2$ have a pulsating form. At points $Y_1$, $Y_2$, and $Y_3$ of the circuit, the potentials are $V_{X'_1} - V_T$, $V_{X'_2} - V_T$, and $V_h - V_T$ respectively. Transistors $T_{12}$ and $T_{22}$ are periodically open but are no longer active.

At instant $t = \tau_1$, the potential at terminal Z vanishes. Transistors $T_1$ and $T_2$ get blocked therefore, and signals $V_{\Phi_1}$ and $V_{\Phi_2}$ are no longer able to reach points $X_1$ and $X_2$ or any other part of the device.

At instant $T = \tau_2$, potential $V'_z$ appears at terminal Z' and transistors $T_{14}$, $T_{24}$ and $T_{34}$ open. The result of this is that potential $V_{y_1}$ at point $y_1$, potential $V_{y_2}$ at point $y_2$, and potential $V_{y_3}$ at point $y_3$ drop to a value corresponding to the value of the threshold voltage $V_T$ of transistor $T_a$. Since transistors $T_{13}$, $T_{23}$ and $T_{33}$ become active, the value of the potentials at points $X'_1$, $X'_2$, and at the terminal $h$ will be equal to $2V_T$.

At instant $t = \tau_3$, signal $\Phi_1$ drops back to zero again, so that the potential at point $y$ of each K-circuit tends to become negative. Since the potential at point $y$ of each K-circuit becomes thus more negative than the value of threshold voltage $V_T$, transistors $T_{13}$, $T_{33}$, $T_{23}$ open and a transfer of charge occurs from condenser $C'_1$ to point $y_1$, from condenser $C'_2$ to point $y_2$, and from condenser $C_h$ to point $y_3$. From these charge transfers, there results a decrease in voltage values at points $X'_1$, $X'_2$, and at terminal $h$, as well as a rise in the values of the potentials at $y_1$, $y_2$, and $y_3$.

At instant $t = \tau_4$, potential $V\Phi_1$ drops back again to zero and the potentials at points $y_1$, $y_2$ and $y_3$ go negative again according to a process similar to the one which took place at instant $\tau_3$. As soon as these potentials are more negative than $V'_{X_1} - V_T$, $V'_{X_2} - V_T$, or $V_h - V_T$ respectively, transistors $T_{13}$, $T_{23}$, and $T_{33}$ open, so that part of the charges accumulated in condensers $C'_1$, $C'_2$, and $C_h$ is brought again to points $y_1$, $y_2$, and $y_3$.

Therefore, the values of the potentials at points $X'_1$ ($V'_{X_1}$), $X'_2$ ($V'_{X_2}$) and at terminal $h$ ($V_h$) drop by a step with every voltage $V\Phi$ drop to 0 until the negative voltage created at points $y_1$, $y_2$, and $y_3$ is no longer sufficient to secure the opening of transistors $T_{13}$, $T_{23}$, and $T_{33}$ (which is what happens for $t > \tau_g$). These negative voltages endure until signal $V_z$ appears and signal $V'_z$ disappears.

The functioning of the device between instants $t_1$ and $t_7$ is identical with that of the device drawn in FIG. 1. It will be noted that the increase in potential at the control electrodes of transistors $T_{11}$ and $T_{12}$ respectively, and at terminal $h$ begins from a negative value.

Figure 11:
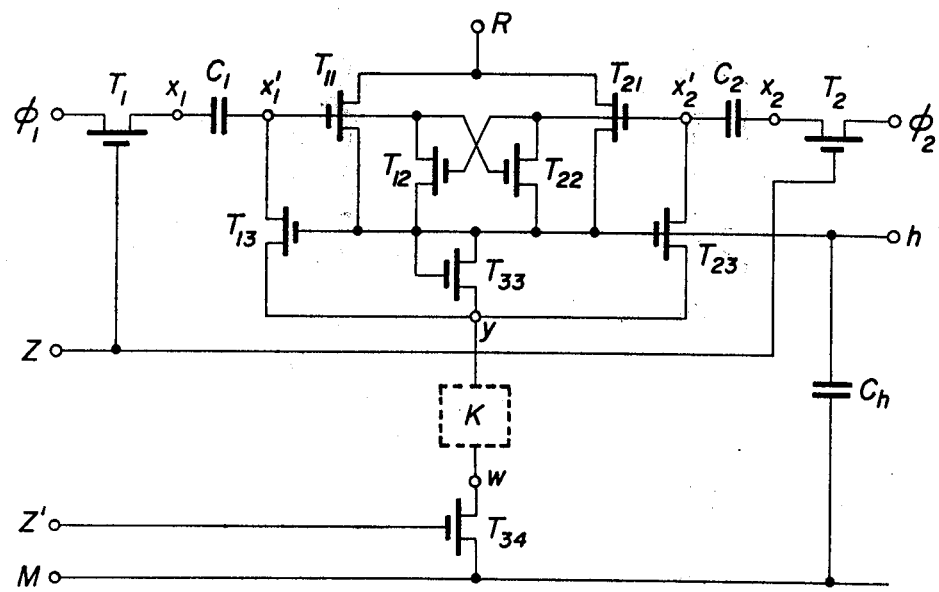
FIG. 11 is a circuit diagram of a modification of the third embodiment.

The modification of the device in accordance withe the invention drawn in FIG. 11 makes it possible to obtain at terminal $h$ a potential which goes cyclically positive and negative, as in the embodiment of FIG. 10, but with fewer electronic components.

In this modification, the device includes seven terminals M, R, $\Phi_1$, $\Phi_2$, Z, Z', and $h$, ten insulated-gate field-effect (IGFET) transistors $T_1$, $T_2$, $T_{11}$, $T_{12}$, $T_{13}$, $T_{21}$, $T_{22}$, $T_{23}$, $T_{33}$, $T_{34}$, three condensers $C_1$, $C_2$, and $C_h$, a K-circuit of the kind drawn in FIG. 7, capable of including a plurality of insulated-gate field-effect (IGFET) transistors $T_a$, $T_b$, ... $T_{n-1}$, $T_n$, as well as a corresponding number of condensers $C_a$, $C_b$, ... $C_{n-1}$, $C_n$.

All the transistors, condensers, and circuit wiring are integrated in a p-type crystal, transistors and condensers being made up of n-type zones and of metal deposits separated from these zones by an insulating layer.

As modification, these zones could be p-type, the crystal then being n-type.

The various terminals of the device are to receive signals which are identical with those to be received by corresponding terminals of the device modification drawn in FIG. 10. Refer back therefore to the pertinent part of the description in reference to that Figure for more details.

It will be noted furthermore that the arrangement and the function of many electronic components of the circuit are identical with the corresponding components included in the device drawn in FIG. 10. This is the case for transistors $T_1$, $T_2$, $T_{11}$, $T_{12}$, $T_{21}$, $T_{22}$, $T_{33}$, $T_{34}$, as well as for condensers $C_1$, $C_2$, and $C_h$.

The structural differences are essentially located at the level of the couplings chosen for transistors $T_{13}$ and $T_{23}$ and for the single K-circuit which is here connected to terminal M through transistor $T_{34}$, which is itself connected to terminal A' by its control electrode. Transistor $T_{13}$ is connected by a secondary electrode to point $X'_1$. Transistor $T_{23}$ is connected by a secondary electrode to point $X'_2$. Transistors $T_{13}$ and $T_{23}$ are both connected by their respective second secondary electrodes to point $y$, and by their respective control electrodes to terinal $h$.

The K-circuit may contain any number of transistors $T_a$, $T_b$, ... $T_{n-1}$, $T_n$ with which corresponding condensers $C_a$, $C_b$, ... $C_{n-1}$, $C_n$ are associated in numbers which depend on the desired amplitude of the a-c voltage at terminal $h$. The K-circuits is connected between point $y$ and terminal M through transistor $T_{34}$ already described.

What is claimed is:

1. An electronic device for the production of pulse signals of an amplitude greater than the amplitude of a given periodic signal, said device comprising:

two supply terminals connectible respectively to a first and second pole of a source of d-c voltage of an amplitude at least equal to the one desired for the said pulse signals, a first of these terminals being a common point of the circuit of the device;

a first input terminal connectible to a first source of periodic voltage producing signals whose period is submultiple of the duration of each of said pulse signals;

a second input terminal connectible to a second source of periodic voltage of the same frequency but phase-opposed in relation to the periodic voltage provided by the first periodic voltage source;

a third input terminal to receive the said periodic signals;

an output terminal to which the said pulses are supplied:

a first IGFET charge transistor connected by one of its secondary electrodes to the said output terminal and by its other secondary electrode to the second of the said supply terminals, the control electrode of the first IGFET charge transistor being connected to the said first terminal through a first coupling circuit including at least one condenser connected at one side to the said control electrode of said first charge transistor;

a second IGFET charge transistor connected by one of its secondary electrodes to the said output terminal and by its other secondary electrode to said second supply terminal, the control electrode of said second IGFET charge transistor being connected to said second input terminal through a second coupling circuit including at least one condenser connected at one side to said control electrode of said second charge transistor;

first and second IGFET decoupling transistors connected by their respective control electrodes to the said third input terminal and by one of their respective secondary electrodes to the plates of the condensers included respectively in the first and second coupling circuits, the other secondary electrode of each decoupling transistor being connected to a power source for supplying the decoupling transistors;

first and second further IGFET transistors each connected by one of its respective secondary electrodes to said output terminal, the other secondary electrode of the first further transistor being connected to the control electrode of the first charge transistor, the other secondary electrode of the second further transistor connected to the control electrode of the second charge transistor, the control electrode of the first further transistor being connected to the control electrode of the second charge transistor, the control electrode of the second further transistor being connected to the control electrode of the first charge transistor;

at least one storage condenser inserted between a first junction point of the circuit connected to said output terminal and said first supply terminal;

means for controlling the discharge of said storage condenser associated with said first junction point of the circuit during a predetermined no-signal period; and means for controlling the discharge of the stray capacity of the control electrode of each charge transistor during at least part of the said no-signal period, all said transistors being of the same conduction type.

2. The device defined in claim 1 wherein each of said decoupling transistors is connected by the first of its respective secondary electrodes to the side of the respective coupling condenser which is connected to the control electrode of the respective charge transistor, and by its second secondary electrode to said first supply terminal, each decoupling transistor constituting the means of discharge of the capacitance associated with the point of the circuit to which the control electrodes of the respective charge transistors are connected.

3. The device defined in claim 2 wherein the means whereby the storage condenser is discharged is constituted by an IGFET discharge transistor connected by a respective secondary electrode to the said output terminal and by its other secondary electrode to the said first supply terminal, the control electrode of said IGFET discharge transistor being connected to an additional input terminal connectible to a source of auxiliary voltage supplying a signal during the said no-signal period.

4. The device defined in claim 2 wherein the means whereby the storage condenser is discharged is constituted by an IGFET discharge transistor connected by a respective secondary electrode to the said output terminal and by its other secondary electrode to the said first supply terminal, the control electrode of said IGFET discharge transistor being connected to the said third input terminal.

5. The device defined in claim 2 wherein the means whereby the storage condenser is discharged is constituted by an IGFET discharge transistor connected by a respective secondary electrode to the said output terminal, by the other secondary electrode to the control electrode of one of said charge transistors, and by its control electrode to the said third input terminal.

6. The device defined in claim 1 wherein each coupling circuit includes two coupling condensers connected in series, each of said decoupling transistors being connected by the first of its secondary electrodes to a common connection point of the two charge condensers and by the respective second secondary electrode to the said first supply terminal.

7. The device defined in claim 6 wherein the said means for controlling the discharge of the storage condenser as well as the means for controlling the discharge of the stray capacity of the control electrode of each charge transistor include for each point of the circuit to be discharged, a first IGFET discharge transistor whose first secondary electrode is connected to the point to be discharged, whose control electrode is connected to this first secondary electrode, and whose second secondary electrode is connected through a bias assembly to the first secondary electrode of a second IGFET discharge transistor whose second secondary electrode in turn is connected to the said first power terminal, and whose control electrode is connected to an additional input terminal to be connected to a source of intermittent voltage which supplies a periodic signal during the said no-signal period the bias assembly including at least one bias stage with an IGFET bias transistor connected in series between the first and second discharge transistors, the control electrode of the second discharge transistor being connected to the closest secondary electrode of this bias transistor, a condenser being connected by one of its plates to the control electrode of this bias transistor, and by the other of its plates to the other of said first and second input terminals, stage by stage, alternately.

8. The device defined in claim 7 wherein the second secondary electrodes of the first discharge transistors are interconnected, the second discharge transistor and the bias assembly being common to the first three discharge transistors, the control electrode of the second discharge transistor being connected to the said third input terminal.

9. The device defined in claim 6 wherein the said means for controlling the discharge of the storage condenser as well as the means for controlling the discharge of the stray capacity of the control electrode of each charge transistor include for each point of the circuit to be discharged, a first IGFET discharge transistor, whose first secondary electrode is connected to the point to be discharged, whose control electrode is connected to the said output terminal and whose second secondary electrode is connected to the corresponding electrode of the other first discharge transistors;

a bias assembly;
one of the said decoupling transistors and the said bias assembly being connected between the second secondary electrode of the first discharge transistors and the first secondary electrode of this decoupling transistor; and
the bias assembly including an IGFET bias transistor connected in series between the first and second discharge transistors whose control electrode is connected to the secondary electrode of this bias transistor which is the closest to the said first discharge transistor, and a condenser connected by one of its plates to the control electrode of this polarization transistor and by the other plate, to the one or to the other of the said first and second input terminals, stage by stage, alternately.

10. The device defined in claim 1 wherein each coupling circuit includes the said coupling condenser and an IGFET transistor connected in series with this condenser, the control electrode of this latter transistor being tied to the said third input terminal, and its second secondary electrode being tied to the first input terminal in a first coupling circuit and to the second input terminal in a second coupling circuit, and latter transistor being thus the said decoupling transistor.

11. The device defined in claim 10 wherein the means for controlling the discharge of the storage condenser as well as the means for controlling the discharge of the stray capacity of the control electrode of each charge transistor include for each point of the circuit to be discharged, a first IGFET discharge transistor, whose first secondary electrode is connected to the point to be discharged, its control electrode is connected to this first secondary electrode, and the second secondary electrode is connected, through a bias assembly, to the first secondary electrode of a second IGFET discharge transistor whose second secondary electrode is connected to the said first power terminal and whose control electrode is connected to an additional input terminal to be connected to an intermittent voltage source sending a signal during the said no-signal period, the bias assembly including at least one bias stage with an IGFET bias transistor connected in series between the first and second discharge transistors whose control electrode is connected to the closest secondary electrode of this bias transistor, and a condenser connected by one of its plates to the control electrode of this bias transistor and by the other plate to the one or the other of the said first and second input terminals, stage by stage, alternately.

12. The device defined in claim 10 wherein the means for controlling the discharge of the storage condenser as well as the means for controlling the discharge of the stray capacity of the control electrode of each charge transistor include for each point of the circuit to be discharged, a first IGFET discharge transistor whose first secondary electrode is connected to the point to be discharged, whose control electrode is connected to the said output terminal, and whose second secondary electrode is connected to the corresponding electrode of the other first discharge transistors, a bias assembly connected between the second secondary electrode of the first discharge transistors and the first secondary electrode of a second IGFET discharge transistor whose second secondary electrode is linked to the said first power terminal and whose control electrode is connected to an additional input terminal to be connected to an intermittent voltage source sending a signal during the said no-signal period, the bias assembly including at least a bias stage with an IGFET bias transistor connected in series between the first and second discharge transistors whose control electrode is connected to the nearest secondary electrode of this bias transistor, and a condenser connected by one of its plates to the control electrode of this bias transistor and by the other of its plates to the other of the said first and second input terminals, stage by stage, alternately.

* * * * *